United States Patent
Bayerer

(10) Patent No.: US 7,808,100 B2
(45) Date of Patent: Oct. 5, 2010

(54) POWER SEMICONDUCTOR MODULE WITH PRESSURE ELEMENT AND METHOD FOR FABRICATING A POWER SEMICONDUCTOR MODULE WITH A PRESSURE ELEMENT

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 12/106,486

(22) Filed: Apr. 21, 2008

(65) Prior Publication Data

US 2009/0261472 A1   Oct. 22, 2009

(51) Int. Cl.
 *H01L 23/34* (2006.01)
(52) U.S. Cl. ............................. 257/719; 257/E23.101; 257/675; 257/690; 257/720; 438/117; 174/261
(58) Field of Classification Search .......... 257/E21.499, 257/E23.101, 625, 675, 678, 690, 703, 704, 257/706, 719, 720, 787; 438/117, 122; 228/121; 174/252, 261
See application file for complete search history.

(56) References Cited

U.S. PATENT DOCUMENTS

| | | | | |
|---|---|---|---|---|
| 5,291,065 A | * | 3/1994 | Arai et al. | 257/723 |
| 5,357,401 A | * | 10/1994 | Gobl et al. | 361/712 |
| 5,497,291 A | * | 3/1996 | Hosen | 361/804 |
| 5,621,243 A | * | 4/1997 | Baba et al. | 257/712 |
| 5,747,875 A | * | 5/1998 | Oshima | 257/687 |
| 6,060,772 A | * | 5/2000 | Sugawara et al. | 257/678 |
| 6,417,532 B2 | * | 7/2002 | Tsunoda et al. | 257/219 |
| 6,424,026 B1 | * | 7/2002 | Mangtani | 257/675 |
| 6,756,667 B2 | * | 6/2004 | Hiyoshi | 257/703 |
| 6,943,443 B2 | * | 9/2005 | Nobori et al. | 257/704 |
| 6,989,590 B2 | * | 1/2006 | Hanada et al. | 257/691 |
| 7,005,739 B2 | * | 2/2006 | Kaufmann et al. | 257/719 |
| 7,361,985 B2 | * | 4/2008 | Yuan et al. | 257/713 |
| 7,482,685 B2 | * | 1/2009 | Fukuda et al. | 257/703 |
| 7,692,293 B2 | * | 4/2010 | Apfelbacher et al. | 257/710 |

FOREIGN PATENT DOCUMENTS

| | | |
|---|---|---|
| DE | 3505086 A1 | 8/1986 |
| DE | 3508456 A1 | 9/1986 |
| DE | 4111247 A1 | 10/1992 |

(Continued)

OTHER PUBLICATIONS

Bayerer et al., "Leistungshalbleitermodule in Direkt-Bonding-Technik," Technische Rundschau, pp. 38-45, vol. 32, No. 88.

(Continued)

*Primary Examiner*—Chris Chu
(74) *Attorney, Agent, or Firm*—Coats & Bennett, P.L.L.C.

(57) ABSTRACT

The invention relates to a power semiconductor module comprising at least one power semiconductor chip, and comprising a pressure apparatus which exerts a pressure on the top side of the power semiconductor chip when the power semiconductor module is fixed to a heat sink. In addition, a bonding wire which is arranged distant from the pressure element, is bonded to the top side. The invention also relates to methods for fabricating a power semiconductor module, and for fabricating a power semiconductor arrangement comprising a power semiconductor module and a heat sink.

13 Claims, 7 Drawing Sheets

FOREIGN PATENT DOCUMENTS

| | | |
|---|---|---|
| DE | 19529237 C1 | 8/1996 |
| DE | 19707514 A1 | 8/1998 |
| DE | 10142971 A1 | 3/2003 |
| DE | 10149886 A1 | 4/2003 |
| EP | 0584668 A1 | 3/1994 |

OTHER PUBLICATIONS

Hala Contec GMBH & Co. KG, "About Thermal Interface Materials," pp. 1-6.

Infineon Technologies, "SIGC158T120R3," ed. 2, Sep. 2003, pp. 1-4.

* cited by examiner

POWER SEMICONDUCTOR MODULE WITH PRESSURE ELEMENT AND METHOD FOR FABRICATING A POWER SEMICONDUCTOR MODULE WITH A PRESSURE ELEMENT

TECHNICAL FIELD

The invention relates to a power semiconductor module and to a method for fabricating a power semiconductor module.

BACKGROUND

Conventional semiconductor modules comprise a baseplate on which one or more power semiconductor chips are arranged. To cool the power semiconductor chips, the power semiconductor module's baseplate is pressed against a heat sink. To improve the transfer of heat, a thermally conductive material, for example a thermally conductive paste, may be introduced between the baseplate and the heat sink in order to compensate for irregularities in the baseplate and the heat sink. However, the thermal conductivity of such thermally conductive materials is much lower than the thermal conductivity of both the heat sink and the baseplate. In principle, therefore, optimum cooling of the power semiconductor chips involved is desired for such arrangements. At the same time, it needs to be possible to fabricate such power semiconductor modules easily and efficiently. This also includes the possibility of making electrical contact with the power semiconductor chips on their top sides facing away from the heat sink using one or more bonding wires. In order to avoid short-circuits and/or a damage of the bonding wires, a deformation of the bonding wires after bonding them to the respective electrical connection partners shall be avoided.

OVERVIEW

A first aspect of the invention relates to a power semiconductor module comprising a support, a power semiconductor chip, a pressure element and a bonding wire. The power semiconductor chip comprises a bottom side, facing the support, and a top side, opposite the bottom side, to which top side the bonding wire is bonded. In a state in which the power semiconductor module has the support fixed to a heat sink, the pressure element, which is arranged distant from the bonding wire, exerts a contact pressure on the top in the direction of the heat sink.

A further aspect of the invention relates to a method for fabricating a power semiconductor module. In this context, a support, a pressure element and a bonding wire are provided. The support comprises a power semiconductor chip arranged on it. A bonding connection is produced between the bonding wire and the top side of the semiconductor chip, which is facing away from the support, and the pressure element is arranged above the top side and distant from the bonding wire.

Yet another aspect of the invention relates to a method for fabricating a power semiconductor arrangement. In this case, a power semiconductor module and a heat sink are provided. The power semiconductor module comprises a support, a power semiconductor chip with a bottom side, facing the support, and with a top side, opposite the bottom side, a bonding wire bonded to the top side, and a pressure element. Fixing the power semiconductor module to the heat sink produces a contact pressure acting on the top side in the direction of the heat sink, the pressure element pushing the power semiconductor chip and the support in the direction of the heat sink with said contact pressure. Thereby, the pressure element is arranged distant from the bonding wire.

BRIEF DESCRIPTION OF THE FIGURES

FIG. 1 shows a power semiconductor module 1 which may be screwed to a heat sink 50 using one or more screws 52. To this end, threaded flanges 11 on a package 10 for the power semiconductor module 1 are provided. The threaded flanges 11 comprise openings 12 through which the screws 52 may be introduced and screwed into corresponding threaded holes 51 in the heat sink 50. The assembly of the power semiconductor module 1 on the heat sink 50 using threaded flanges 11 fitted to the outside of the package 10 is merely exemplary. As an alternative or in addition, the power semiconductor module 1 may also be pressed against the heat sink 50 using a central assembly opening, for example, or using clamping or pressure springs.

Figure 1:
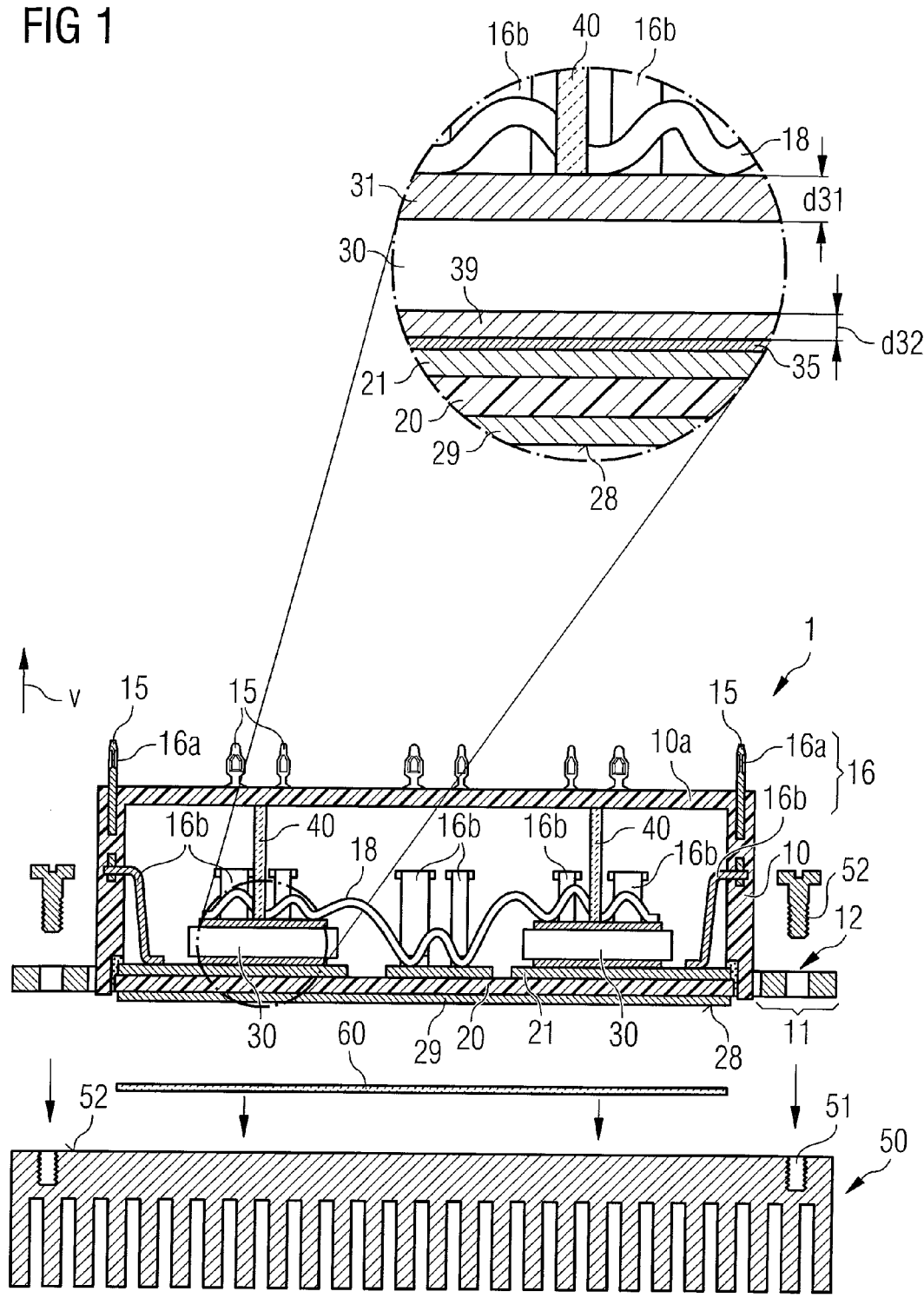
FIG. 1 shows a power semiconductor module comprising a pressure element, which is arranged above a top connection metallization of a power semiconductor chip, in cross section.

The power semiconductor module 1 comprises a support 20 which is provided with a patterned top—i.e. arranged in a vertical direction v—metallization 21 and with a continuous bottom—i.e. arranged in a direction opposite the vertical direction v—metallization 29 and which terminates the package 10 at the bottom side. The bottom metallization 29 thus also forms the bottom side of the power semiconductor module 1. In this context, the vertical direction v is understood to mean a direction which runs perpendicular to the patterned metallization 21 facing the inside of the module and points from the patterned metallization 21 in the direction of the inside of the module. The support 20 is electrically insulating and may be formed from a ceramic, for example from alumina ($Al_2O_3$) or from silicon nitride ($Si_3N_4$) or from aluminum nitride (AlN), or from plastic. By way of example, the support 20 together with its patterned top metallization 21 and possibly with its optional bottom metallization 29 may be in the form of a DCB (Direct Copper Bonding) substrate, in the form of a DAB (Direct Aluminum Bonding) substrate, or in the form of an AMB (Active Metal Brazing) substrate.

A support 20 which is metallized at least on the top may have (without the metallizations 21, 29) a thickness in the range of 0.1 mm to 2 mm, for example, e.g. less than or equal to 0.635 mm, less than or equal to 0.38 mm, less than or equal to 0.32 mm or less than or equal to 0.25 mm. The thicknesses of the top metallization 21 and—to the extent provided—bottom metallization 29 may be, independently of one another, 50 μm to 1000 μm, for example, e.g. 300 μm, more than 300 μm, more than or equal to 400 μm, more than or equal to 500 μm, or more than or equal to 600 μm.

On account of the patterning, the top metallization 21 comprises a conductor structure which comprises interconnects and also one or more pads for power semiconductor chips 30. The bottom metallization 29 is provided, inter alia, for the purpose of avoiding bending, as would arise when a thin support 20 metallized only on its top is heated, on account of different coefficients of thermal expansion for the support 20 and the metallization 21. In principle, it is also possible to dispense with the bottom metallization 29, however, if this does not result in unacceptable impairment of the heat transfer resistance between the heating 50 and the power semiconductor module 1 fixed thereto. In this regard, to increase mechanical stability, for example, the support 20 metallized only on one side may be of thicker design than a support metallized on two opposite sides—under otherwise identical conditions and with the same cooling success to be attained. If the bottom metallization 29 is dispensed with, the insulating support 20 forms the side of the power semiconductor module 1.

The power semiconductor chips 30, which may be in the form of IGBTs, in the form of MOSFETs, in the form of J-FETs, in the form of thyristors or in the form of diodes, for example, have a respective top metallization 31, forming a load connection for the power semiconductor chip 30, on their top, which is facing away from the support 20. As a further load connection for the power semiconductor chip 30, a respective bottom metallization 39 is provided which is arranged on the side of the power semiconductor chip 30 which faces the support 20. By way of example, the load connections 31, 39 may be source connections, drain connections, collector connections, emitter connections, anode connections or cathode connections. The bottom metallization 39 is electrically conductively connected to a section of the top metallization 21 of the support 20. This electrically conductive connection may be produced using a connecting layer 35 which is arranged between the bottom metallization 39 of the power semiconductor chip 30 and the top metallization 21 of the support 20. The connecting layer 35 may be a solder, for example a eutectic solder, an alloy layer (diffusion solder) comprising metals, a silver-containing layer (e.g. produced using a low temperature connection method) or an electrically conductive adhesive. Regardless of the type of electrical contact connection, it is advantageous to perform this over as large an area as possible in order to minimize the heat transfer resistance between the power semiconductor chip 30 and the support 20.

For the purpose of making electrical contact with the power semiconductor module 1 externally, connection contacts 15 are provided which—as depicted—may be in the form of press fit contacts, for example. As an alternative or in addition, connection contacts 15 may also be provided which are in the form of a resilient contact element or which have a mounting opening. It is equally possible for connection contacts 15 to be in the form of a threaded hole, for example in the form of a screw nut which is embedded in the package 10 of the power semiconductor module 1.

Certain instances of the connection contacts 15 are provided for the purpose of supplying a supply voltage to the power semiconductor module 1. Other instances of the connection contacts 15 may—depending on the function of the power semiconductor module 1—provide one or more, for example frequency-modulated, output voltages. If one or more of the power semiconductor chips 30 are in the form of controllable power semiconductor components, further instances of the connection contacts 15 may also be used to supply a control voltage to the associated control connection. By way of example, the power semiconductor module 1 may have the function of a single switch with one or else more controllable power semiconductor chips 30 connected in parallel with one another. Equally, the power semiconductor chips 30 may also be connected up to form one or more half-bridges, one or more full-bridges, or a "six pack" comprising six power semiconductor chips connected to for three half-bridges, or other assemblies with an arbitrary function. Suitable applications of such power semiconductor modules 1 are frequency converters, engine controllers, switched-mode power supplies, rectifiers and other power circuits, for example.

To connect the connection contacts 15 electrically conductively to the power semiconductor chips 30, to the patterned top metallization 21, or to other electrical components of the power semiconductor module 1, metal connection lugs 16 are provided. In the case of the present example, the connection lugs 16 are of two-part design and comprise a top lug element 16a and a bottom lug element 16b which may be pressed, soldered or welded together, for example. In this case, the top lug element 16a and its connection contact 15 may be made of a material which is harder than the material of the bottom lug element 16b. The connection contacts 15 are connected to the corresponding top lug elements 16a and may—as shown in FIG. 1—also be designed as an integral part of the top lug elements 16a.

Optionally, the top lug elements 16a may be molded into the package 10, or cast integral, or inserted into guide elements in the package 10. Instead of two-element or multi-element connection lugs 16, a connection lug 16 may in principle also be of integral design.

To connect the power semiconductor chips 30 to the external connection contacts 15 and/or to one another, one or more bonding wires 18 are provided in addition to the patterned top metallization 21 of the support 20 and in addition to the connection lugs 16. The bonding wires 18 are used, inter alia, to connect the top metallization 31 of the power semiconductor chips 30 electrically conductively to sections of the patterned top metallization 21 of the support 20 and/or to connection lugs 16. In this context, one or more bonding wires 18 may be bonded to each top metallization 31 of a power semiconductor chip 30. For operation, the power semiconductor module 1 is fixed to a heat sink 50, so that the bottom side 28 of the power semiconductor module 1 is in good thermal contact with the heat sink 50. The heat to be dissipated from the power semiconductor module 1 is produced predominantly in the power semiconductor chips 30, which means that good heat dissipation is advantageous.

During operation of the power semiconductor module 1, the highest temperatures are reached in the central region of the power semiconductor chips 30. Pressure elements 40 are therefore provided which exert a contact pressure, e.g. more than 5 N, more than 10 N, more than 20 N, more than 100 N or more than 500 N, on the power semiconductor chip 30 in the direction of the heat sink 50 when the power semiconductor module 1 is fixed to the heat sink 50. By way of example, the pressure elements 40 are formed from metal, plastic or ceramic and may have no electrical function, or else—in the case of an electrically conductive material—may take on an electrical function. They may be in electrically conductive or electrically insulating form.

In this context, the contact pressure of such pressure elements 40 is exerted specifically on the power semiconductor chips 30, and not on a point of the metallized support 20 between or next to the power semiconductor chips 30. The advantage resulting from such pressure elements 40 increases with the size of the power semiconductor chips 30, i.e. a pressure element 40 may be provided for a power semiconductor chip 30 when the shortest edge length of the power semiconductor chip 30 is greater than or equal to a prescribed value, e.g. 7 mm, or when the power semiconductor chip 30 (when projected onto the top of the metallized support 20) has a base area of more than 65 mm$^2$, of more than 80 mm$^2$ or of more than 100 mm$^2$.

In the case of the arrangement shown in FIG. 1, the pressure elements 40 have their top end connected permanently to the package 10. Since the bottom 28 of the metallized support 20 projects from the connection flanges 11 in the direction of the heat sink 50, a force is produced, when the power semiconductor module 1 is fixed to the heat sink 50, which the package 10 exerts on the pressure elements 40. The pressure elements 40 in turn transfer this contact pressure to the power semiconductor chips 30, so that these together with the underlying sections of the metallized support 20 are pushed in the direction of the heat sink 50. This contact pressure therefore results in a local reduction in the thickness of an optional heat conducting element 60 provided between the power semiconductor module 1 and the heat sink 50 under the power semiconductor chip 30. The reduction in thickness therefore occurs precisely below the point at which the highest temperatures in the power semiconductor module 1 are reached. The result of this locally reduced thickness of the heat conducting element 60 is better thermal coupling of the power semiconductor module 1 to the contact area 52 of the heat sink 50, and accompanying better cooling of the power semiconductor chips 30.

A heat conducting element 60 may be electrically conductive or electrically insulating. By way of example, it may be a silicone film without mechanical reinforcement or a silicone film with mechanical reinforcement, for example by virtue of the addition of glass fibers. Equally, technical plastic films, phase change coatings, soft polymer contact coatings, gap fillers made of soft elastomers with or without mechanical reinforcement, for example by virtue of the addition of glass fibers, or adhesive films with electrically insulating supports may be used as the heat conducting element 60. In the case of thermally conductive films or gap fillers, it is possible to use highly crosslinked elastomers, e.g. silicones, mixed with thermally conductive ceramics (e.g. boron nitride, aluminum nitride, or mixtures of boron nitride and aluminum nitride). Examples of suitable electrically and thermally conductive elements 60 are aluminum with a phase change coating or a polymer coating, graphite films (e.g. with a graphite proportion of more than 98%), thermally conductive adhesive films or thermally conductive pastes.

A pressure element 40 is proportioned, at least on its associated power semiconductor chip 30, such that it can only locally exert a pressure of, by way of example, more than 1.25 N/mm$^2$, more than 2.5 N/mm$^2$, more than 5 N/mm$^2$, more than 25 N/mm$^2$ or more than 125 N/mm$^2$ on the top metallization 31, so that there still remains sufficient free area of the top metallization 31 at the side next to the contact area to bond one or more bonding wires 18 to said metallization.

To prevent any damage to a power semiconductor chip 30 by the pressure element 40 pressing against this power semiconductor chip 30, various measures can be taken. An example of one option is to choose the thickness d31 of the top metallization 31 over the entire area of the metallization or at least locally to be thicker than in the case of a comparable conventional power semiconductor chip. In this context, the increased thickness d31 may also be chosen to be greater than the thickness d32 of the bottom metallization 39 of the power semiconductor chip 30. The thickness d31 of the top metallization 31 may be more than 6 μm, more than 10 μm or more than 20 μm, for example. In addition, the top metallization 31 may comprise just one layer, or else a plurality of sublayers. Examples of suitable sublayers are layers made of or containing aluminum and/or copper, made of or containing nickel, and nickel alloys. In addition, the metallizations 31, 39 may also be provided with protective layers to prevent oxidation on the surface.

In the case of a multilayer metallization 31, 39, one or more of the sublayers may be in the form of thin intermediate layers with a thickness of less than 1 μm, for example, which are arranged between other sublayers. By way of example, the intermediate layers may be used as diffusion barriers preventing certain substances, e.g. copper, from diffusing into the semiconductor body of the power semiconductor chip 30. Another function of such intermediate layers may be to prevent the formation of hillocks and/or to improve the metallization's resistance to sudden changes of temperature. To this end, such an intermediate layer may be formed from titanium (Ti), titanium nitride (TiN), tantalum (Ta), tantalum nitride (TaN), tantalum silicon (TaSi), tantalum silicon nitride (TaSiN) or tungsten (W), for example. In addition, intermediate layers may be used as cohesion layers, e.g. made of titanium nitride (TiN), aluminum (Al), aluminum silicon (AlSi), aluminum copper (AlCu), aluminum silicon copper (AlSiCu), nickel (Ni), palladium (Pd), gold (Au), or made of other materials, which improves the mechanical adhesion of another layer to be applied. An example of a form of the top metallization 31 which may be mentioned is a layer sequence which successively comprises, starting from the semiconductor chip 30, an aluminum layer approximately 3 μm thick, a layer of nickel or nickel alloy approximately 6 μm thick, and a layer of palladium.

Figure 2:
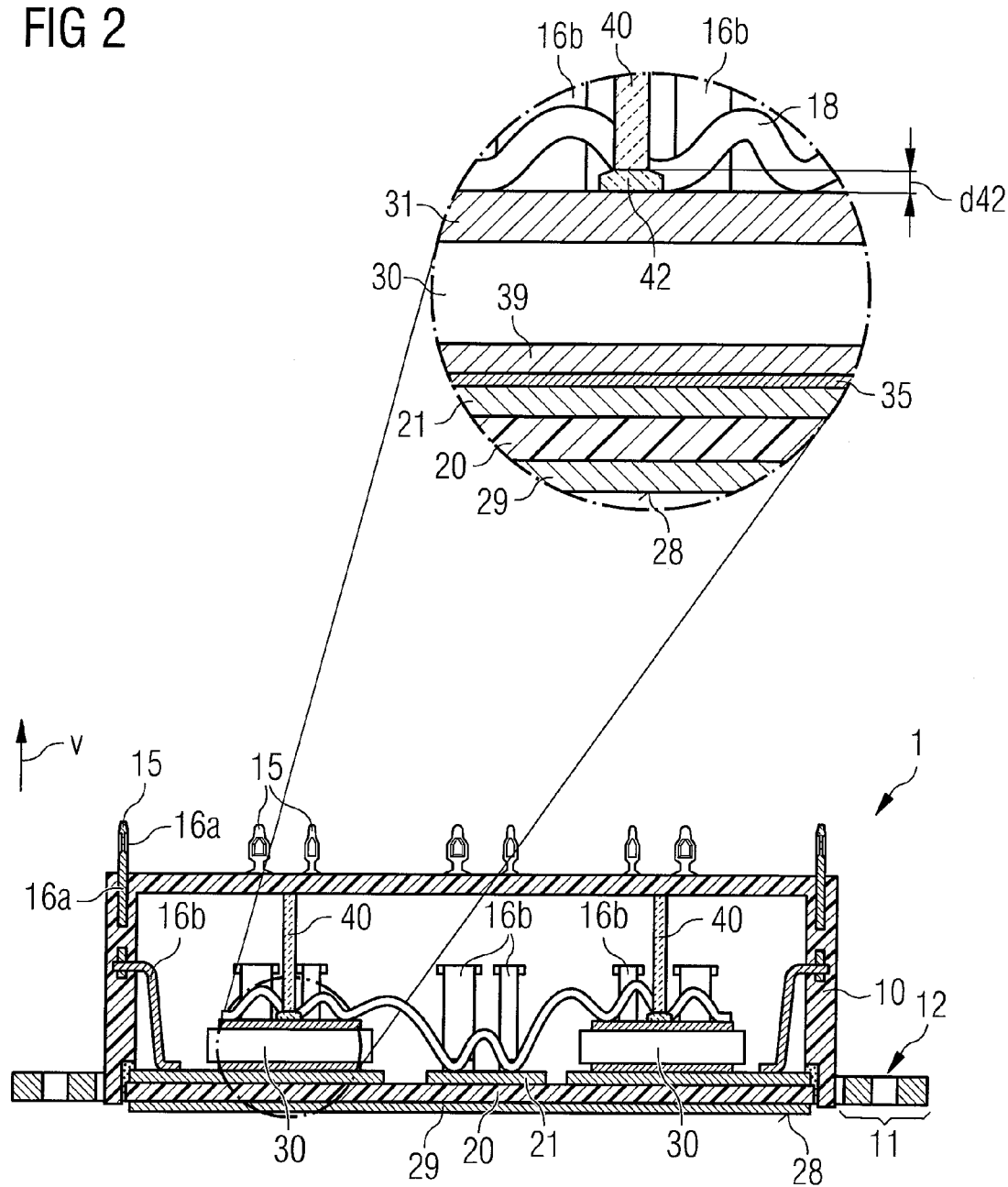
FIG. 2 shows a power semiconductor module in which a pressure distribution element is arranged between the pressure element and the power semiconductor chip, in cross section.

As an alternative or in addition to a thicker top metallization 31 for the power semiconductor chip 30, a pressure distribution element 42 may also be provided, as shown in FIG. 2. The pressure distribution element 42 is arranged between the pressure element 40 and the top metallization 31 of the power semiconductor chip 30. The modulus of elasticity of the pressure distribution element 42 is lower than the modulus of elasticity of the pressure element 40. An example of suitable material for the pressure distribution element 42 is silicone. The silicone may be applied to the top metallization 31 in the form of drops, for example, and then cured. The thickness d42 of the pressure distribution element 42 may be, by way of example, more than 6 μm, more than 10 μm, more than 20 μm and, by way of example, less than 50 μm or less than 100 μm.

A pressure distribution element may, in principle, also comprise any materials other than silicone. Suitable examples are also silicon nitride ($Si_3N_4$) or polyimide, i.e. materials which are used as a passivation layer when fabricating the power semiconductor chips 30 anyway. For this reason, a pressure distribution element 40 may also be produced easily by producing a passivation layer for the power semiconductor chip 30, at least in the region A of the top side on which a contact pressure is intended to act on the power semiconductor chip 30 provided in the power semiconductor module 1, with a thickness, for example greater than or equal to 6 μm, which is greater than the thickness of the passivation layer of conventional power semiconductor components. It goes without saying that the passivation layer applied to the top metallization 31 may also have a thickness of greater than 6 μm overall, i.e. at any point.

Figure 3:
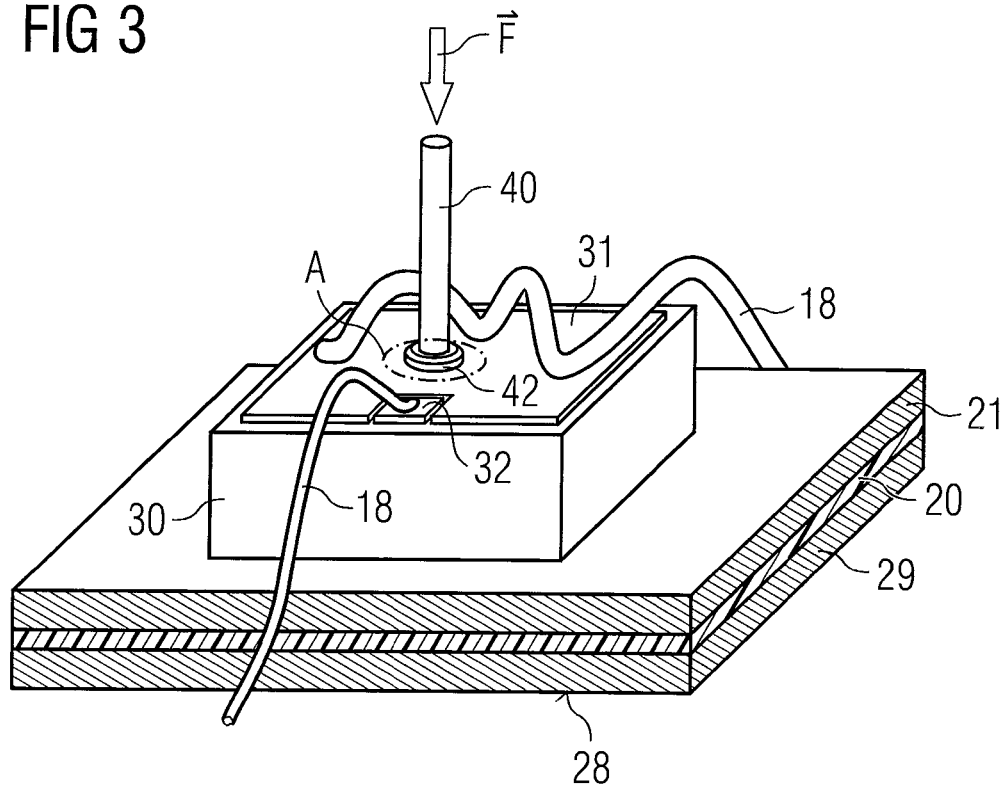
FIG. 3 shows a perspective view of a section of a power semiconductor module in which the top side of the semiconductor chip comprises a load connection and a control connection arranged on the top side, with the pressure element exerting a contact pressure on the load connection in its central region.

FIG. 3 shows a perspective view of a section of a power semiconductor module with a power semiconductor chip 30. This view shows that the contact pressure F with which the pressure element 40 pushes the power semiconductor chip 30—indirectly via the pressure distribution element 42, or alternatively directly, as shown,—starts approximately at the area's center of gravity of the top metallization 31 on the power semiconductor chip 30.

The power semiconductor chip 30 shown in FIG. 3 is a controllable power semiconductor chip, which is why the top of the power semiconductor chip 31 comprises a further connection metallization 32 provided on it which is the control connection for the power semiconductor chip 30. The control connection 32 is electrically connected by means of a bonding wire 18, which may comprise a smaller diameter than the bonding wire 18 which is used to connect the load connection 31. To fabricate such a power semiconductor module, the power semiconductor chip 30 is first of all assembled on the metallized support 20. At a later time, but before the pressure element 40 is put in place, the bonding wires 18 are bonded to the points of the connection metallizations 31 and 32 which are provided for this purpose. The bonding on the top side of the chip expediently takes place before the positioning of the pressure element 40, so that the bonding tool is not hampered by the pressure element 40 when the bonding connections are produced. In this case, it is naturally necessary to ensure that no bonding connection is produced on a central top side section A of the power semiconductor chip 30 nor that this top side section A is traversed by a bonding wire 18. Otherwise, there would be the risk that the bonding connection or the bonding wire is damaged or destroyed by the positioning of the pressure element 40.

To compensate for tolerances such as may arise when positioning the pressure distribution element 42 and/or the pressure element 40, the top side section A may be chosen to be larger than the contact area between the top of the power semiconductor chip 30 and the pressure distribution element 42 or—when the pressure element 40 acts directly on the metallization 31—the pressure element 40. By way of example, the top side section A may have an area of less than or equal to 2 mm×2 mm. In addition, the bottom end of a pressure element 40 may extend in any lateral direction, i.e. a lateral direction perpendicular to the vertical direction v, over a range of no more than 2 mm. In addition, the top side section A may have an area greater than or equal to 1 mm×1 mm, for example. Equally, the bottom end of a pressure element 40 may extend in any lateral direction over a range of at least 1 mm.

It is also advantageous if the control connection 32 is arranged outside of the top side section A. In the present exemplary embodiment, the control connection 32 is arranged on the lateral edge of the patterned top metallization 31, 32 of the semiconductor chip 30.

Figure 4:
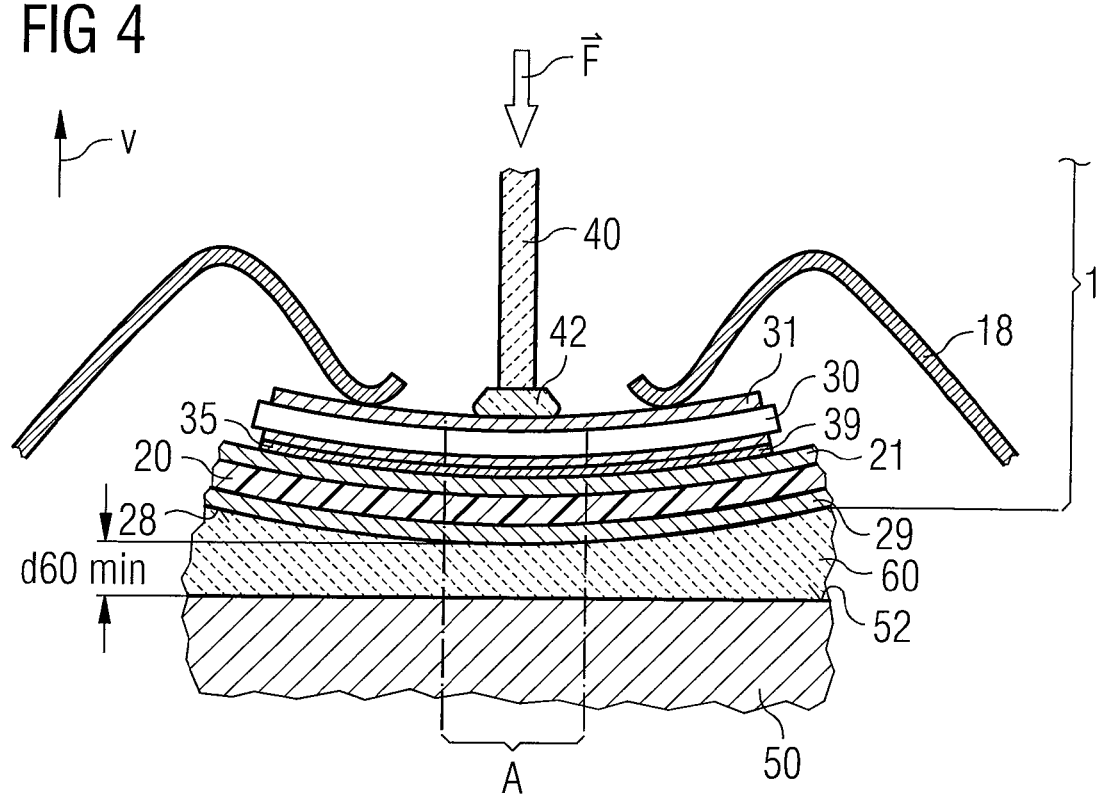
FIG. 4 shows a power semiconductor arrangement comprising a heat sink, and a power semiconductor module in which a support fitted with a power semiconductor chip is pressed against a heat sink by the pressure exerted on the power semiconductor chip by a pressure element, in cross section.

FIG. 4 shows a vertical section through a section of a power semiconductor module 1, fixed to a heat sink 50. In this case, a contact pressure F is exerted by means of a pressure element 40 approximately in the region of the area's center of gravity of a top connection metallization 31 on the power semiconductor chip 30. The contact pressure F therefore pushes the power semiconductor chip 30 together with the metallized support 20 in the direction of the heat sink 50, so that the thickness of a thermally conductive element 60 introduced between the bottom side 28 of the power semiconductor module 1 and the heat sink 50 is reduced locally down to a thickness $d60_{min}$, for example less than 30 μm, less than 20 μm or less than 10 μm. This is accompanied by a reduction in the heat transfer resistance between the power semiconductor module and the heat sink 50 locally below the center of the power semiconductor chip 30. In the case of the arrangement shown in FIG. 4, a pressure distribution element 42 is provided, as has also been explained with reference to FIGS. 2 and 3.

Figure 5:
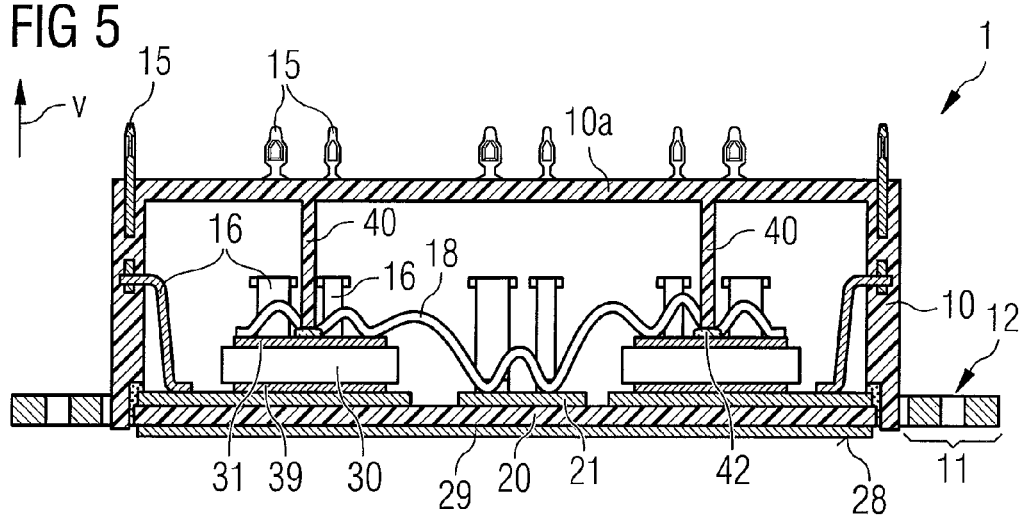
FIG. 5 shows a power semiconductor module in which a pressure element is designed as an integral part of a package of the power semiconductor module, in cross section.

In the case of the semiconductor modules 1 explained with reference to FIGS. 1 and 2, the package 10 and the pressure elements 40 are mutually independent components. Alternatively, the pressure elements 40 may also be designed as an integral part of the package 10. An example of this is shown in FIG. 5, which otherwise corresponds to the arrangement shown in FIG. 2. In the arrangement shown in FIG. 5, the package 10 and the pressure elements 40 are produced in a joint injection molding process. Alternatively, prepared pressure elements 40 may naturally also have their top end molded into the package 10 too when it is produced. The permanent connection between the pressure elements 40 and the package 10 allows a high degree of positioning accuracy for the bottom ends of the pressure elements 40 on the tops of the associated power semiconductor chips 30. When such a power semiconductor module 1 is fabricated, the package is put onto the metallized support 20, fitted with the power semiconductor chips 30, following production of the bonding connections such that the bottom free ends of the pressure elements 40 are positioned above or on the top side sections A.

If, as in the examples shown in FIGS. 2 to 5, a pressure distribution element 42 is provided, this pressure distribution element 42 may first of all be positioned above the top side section A on the top side of the power semiconductor chip 30 and then the package 10 with the pressure elements 40 assembled thereon may be placed onto the prepared metallized support 20, fitted with the power semiconductor chips 30 and bonded, such that the pressure distribution elements 42 are positioned above the sections A. Alternatively, the pressure distribution elements 42 may also first of all be assembled on the bottom ends of the pressure elements 40 and may then be placed together with these elements and the package 10 onto the prepared support 20.

Figure 6:
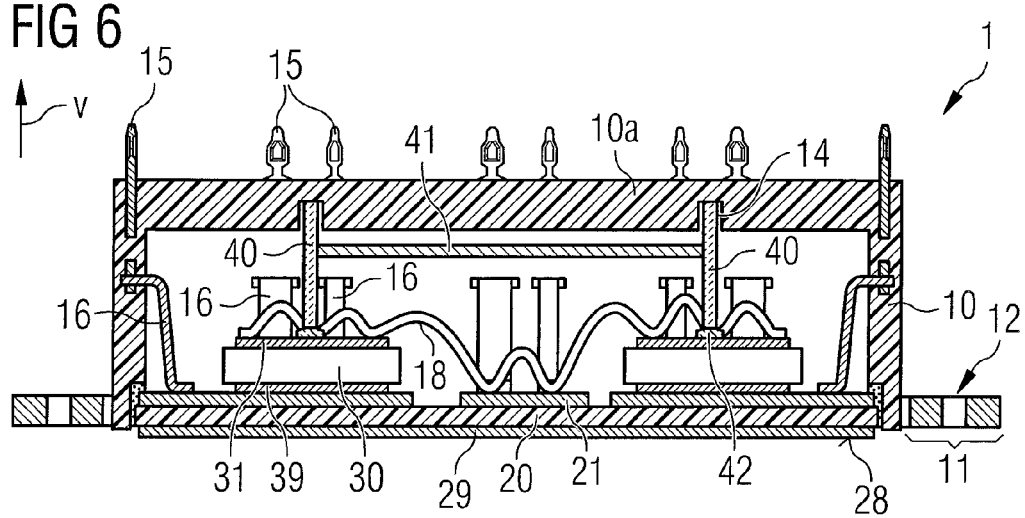
FIG. 6 shows a power semiconductor module comprising two pressure elements which are connected to one another by means of a connecting web, in cross section.

As a further example, FIG. 6 shows a power semiconductor module 1 comprising a plurality of pressure elements 40 which are connected to one another by webs 41. The pressure elements 40 and the webs 41 form a rigidly connected unit, as shown by way of example in FIG. 7 in a perspective view. The advantage of such a unit is that—unlike individual pressure elements 40—they do not tip over when they have their bottoms positioned on the associated top metallizations 31 of the power semiconductor chips 30 or on the associated pressure compensation elements 42. A power semiconductor module as shown in FIG. 6 may therefore be fabricated by placing a unit as per the arrangement shown in FIG. 7 with the bottom ends of the pressure elements 40 onto the metallized support 20, fitted with the power semiconductor chip 30 and provided with bonding wires 18, such that the bottom ends of the pressure elements 40 are respectively positioned above a top side section A of one of the power semiconductor chips 30. A package 10 may then be placed onto the component-assembled metallized support 20 and the unit positioned thereon shown in FIG. 7, so that the top of the package 10 exerts a contact pressure on the pressure elements 40 when the power semiconductor module 1 is fixed to a heat sink.

Figure 7:
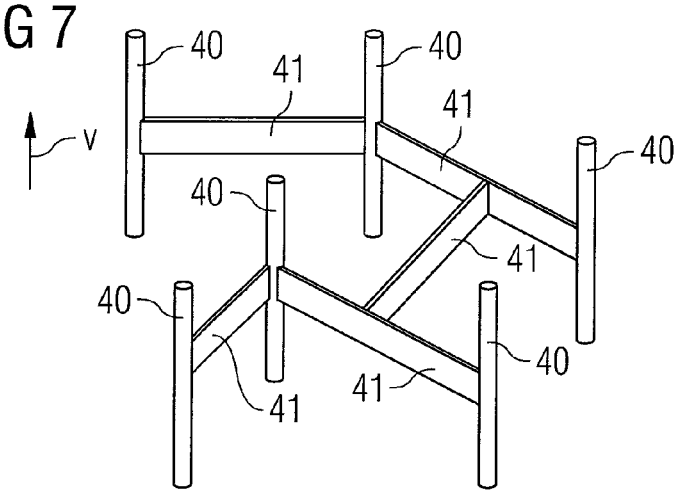
FIG. 7 shows a plurality of pressure elements which are connected to one another by means of webs, in a perspective view.

Optionally, the package cover 10a may comprise depressions 14 on its side facing the interior of the module which correspond to the top ends of the pressure elements 40 shown in FIG. 7 and into which the top ends of the pressure elements 40 shown in FIG. 7 are inserted when the package 10 is put on. Optionally, before the package 10 is put on, this may involve an adhesive being introduced into the depressions 14, which adhesively bonds the unit shown in FIG. 7 to the package 10.

Another possibility for producing an arrangement as shown in FIG. 6 is to adhesively bond a unit as shown in FIG. 7 to a prepared package 10 and to place this package onto the component-assembled, metallized and bonded support 20, as when fabricating the power semiconductor module 1 shown in FIG. 5.

Figure 8:
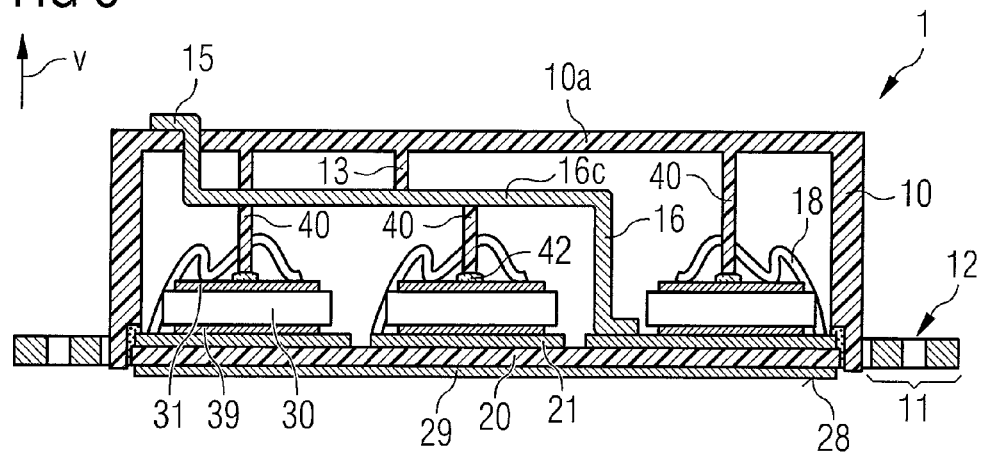
FIG. 8 shows a power semiconductor module in which a pressure element is arranged between a power semiconductor chip and a conductor rail, in cross section.

In another example, shown in FIG. 8, the power semiconductor module 1 comprises a connection lug 16 which is in the form of a stable conductor rail and, by way of example, may be produced from a punched and bent sheet. This conductor rail 16 has a horizontally running section 16c which is routed over the connection metallization 31 of at least one of the power semiconductor chips 30. This horizontally running section 16c and at least one of the connection metallizations 31 comprise a respective connection element 40 arranged between them. In addition, the package cover 10a comprises, on the inside of the module, an extension 13 which, when the power semiconductor module 1 has its bottom side 28 fixed to a heat sink, produces a contact pressure which acts on the connection lug 16 and which is passed on from the latter's horizontal section 16c via the pressure element 40 and the optional pressure distribution element 42 to the power semiconductor chip 30 and to the metallized support 20.

Figure 9:
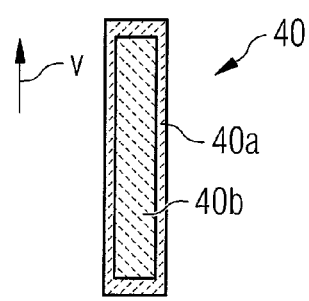
FIG. 9 shows a vertical section through a pressure element which comprises a jacket which is filled with a material which has a higher coefficient of thermal expansion than the package of the power semiconductor module, in cross section.

In all the examples explained hitherto, the contact pressure has been produced primarily by virtue of the power semiconductor module 1 having been fixed to a heat sink. Another possibility for producing a contact pressure is to use a pressure element 40, as shown in FIG. 9. This pressure element 40 comprises a jacket 40a which is filled with a material 40b. The coefficient of thermal expansion of this material 40b is greater than the coefficient of thermal expansion of the package 10. When the power semiconductor module heats up on account of operation, the pressure element 40 expands to a greater extent than the package 10, which means that the contact pressure acting on the relevant power semiconductor chip 30 increases as the temperature of the power semiconductor module 1 increases, and, as an accompaniment to this, the thermal transfer resistance between the bottom side 28 of the power semiconductor module 1 and the heat sink is reduced. The coefficient of thermal expansion of the filling material 40b may be a linear coefficient of thermal expansion, for example, of more than 50 ppm/K or of more than 80 ppm/K. An example of a suitable filling material is silicone oil, silicone gel, silicone rubber, or wax, which becomes liquid as the temperature rises, so that the volume increases greatly, etc. This value is significantly higher than the corresponding linear coefficient of thermal expansion in the range of approximately 30 ppm/K for a conventional plastic package.

Yet another possibility for exerting a contact pressure on a power semiconductor chip 30 or for intensifying a contact pressure conveyed by the package 10 is to use a pressure element 40 which heats up and accordingly expands in a direction v perpendicular to it's the top side of the power semiconductor chip 30 as the temperature of the power semiconductor chip 30 increases. Suitable materials for this are not only materials with isotropic thermal length expansion but also those with anisotropic thermal length expansion, the pressure element 40 being oriented such that the direction with the greatest coefficient of length expansion is identical to the direction perpendicular to the top side of the power semiconductor chip 30.

Figure 10:
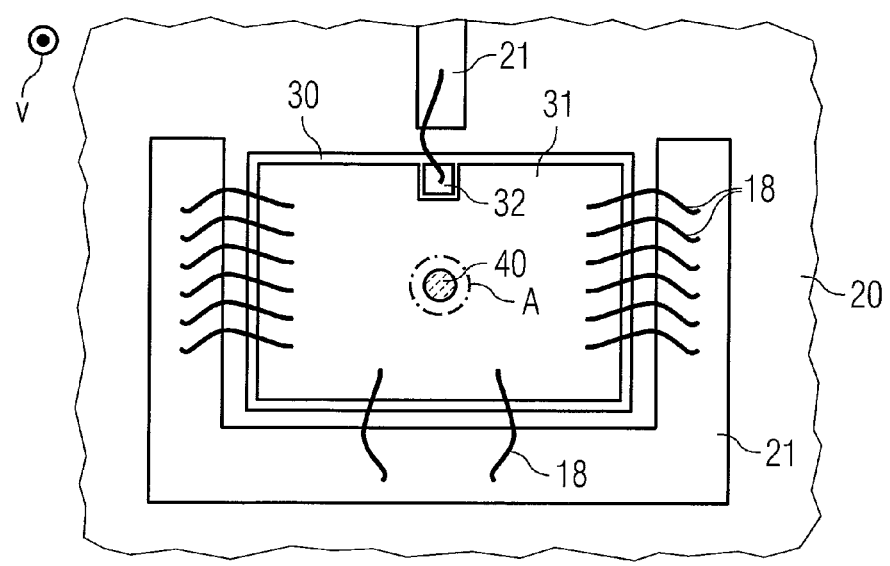
FIG. 10 shows a section of a power semiconductor module in the region of a connection element, a number of bonding wires being bonded to the top load connection of a power semiconductor chip, so that the bonding points are arranged in a U shape around the section of the top side load connection, at which the pressure element exerts its contact pressure on the power semiconductor chip, in a sectional plane through the pressure element which runs parallel to the support.

FIG. 10 shows a horizontal section through a section of a power semiconductor module viewed from a direction onto the power semiconductor chip 30 and the metallized support 20. The figure shows the support 20 with its patterned top metallization 21, the power semiconductor chip 30 with its top connection metallizations 31, 32 and the bonding wires 18 which electrically conductively connect the top metallizations 31, 32 to prescribed sections of the patterned metallization 21. To increase the current carrying capability, a plurality of bonding wires 18 are electrically connected in parallel for the purpose of making electrical contact with the load connection 31. The bonding points between these bonding wires 18 and the load connection 31 are in this case arranged along a U-shaped line around the top side section A of the chip top side, so that the region of the power semiconductor module which is above the section A is free of bonding wires 18. Instead of an arrangement along a U-shaped line, other arrangements, for example along an annular line, are also suitable. What is crucial is that the central region of the top side chip metallization 31 is kept free of bonding wires. This prevents the bonding connection from becoming damaged or destroyed when the bottom end of the pressure element 40 is positioned above the top side section A. In the example shown in FIG. 10, the section of the patterned top metallization 21 on the support 20, which is electrically conductively connected to the bonding wires 18 which make contact with the metallization 31, is arranged in a U shape around the power semiconductor chip 30 in the plan view.

Figure 11:
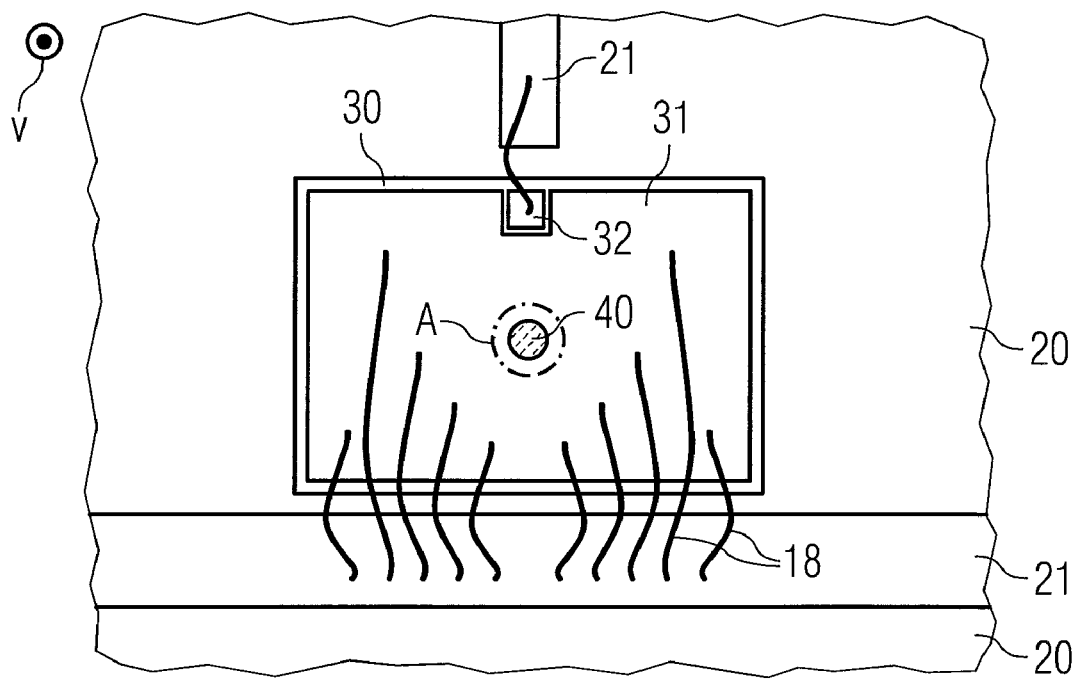
FIG. 11 shows a section of a power semiconductor module in which a number of bonding wires which makes contact with the top side of the power semiconductor chip is split into two subgroups, in a sectional plane through the pressure element which runs parallel to the support.

The arrangement shown in FIG. 11 likewise shows a horizontal section through a section of a power semiconductor module when looking at the power semiconductor chip 30 and the support 20. In this exemplary embodiment, the bonding points which are used to connect the load connection 31 to a section of the patterned metallization 21 are split into two groups which are arranged on opposite sides of the connection metallization 31.

Figure 12:
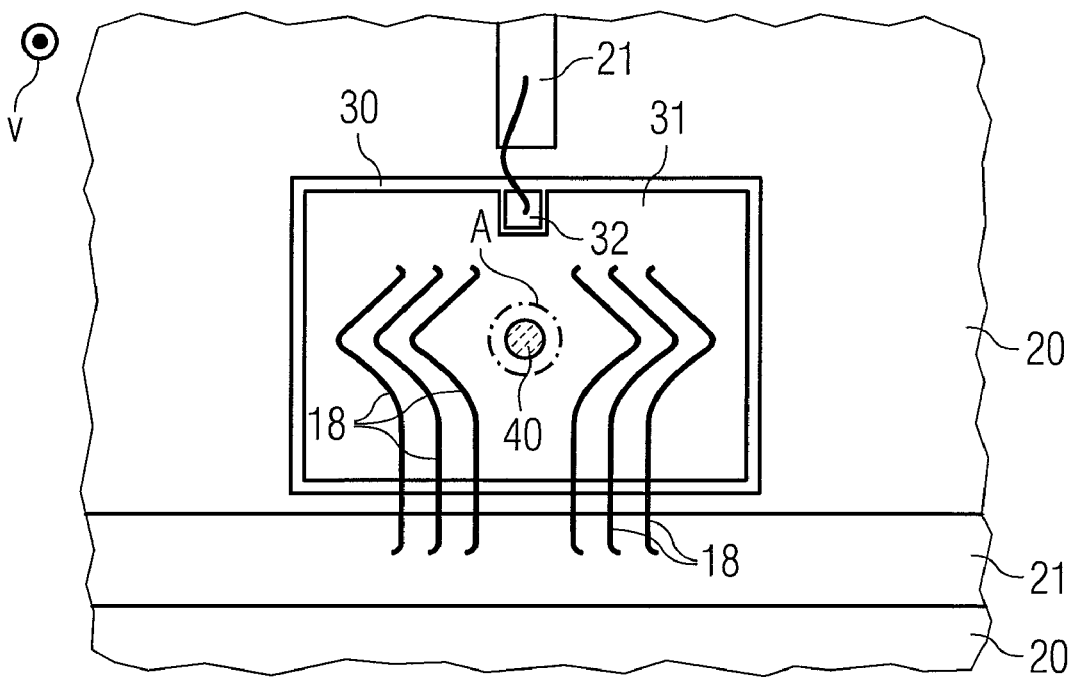
FIG. 12 shows a section of a power semiconductor module in which bonding wires which are bonded to the top side of a power semiconductor chip are routed, in each case by means of three bonding points, around the section of the top side which is provided for introduction of the contact pressure by the pressure element, in a sectional plane through the pressure element which runs parallel to the support.

A corresponding view is shown in FIG. 12, with the difference that each of the bonding wires 18 is routed at the sides around the region above the top side section A to use at least three respective bonding points 18a, 18b, 18c, in order to prevent one of the bonding wires 18 from damaging or destroying one of the bonding wires 18 when the bottom end of the pressure element 40 is positioned above the top side section A.

Figure 13:
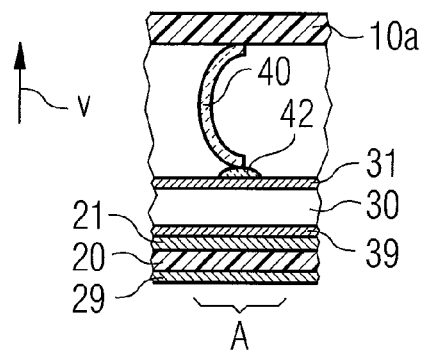
FIG. 13 shows a vertical section through a section of a power semiconductor module in which the pressure element comprises a C-shaped cross section.

FIG. 13 shows a vertical section through a section of a power semiconductor module, as has already been explained above with reference to various exemplary embodiments. In the case of the power semiconductor module shown in FIG. 13, the pressure element 40 comprises a C-shaped cross section. This gives the pressure element 40 a resilient form, so that the pressure element 40 pushes the contact region A of the power semiconductor chip 30 when the package 10 is put onto the component-assembled support 20.

Figure 14:
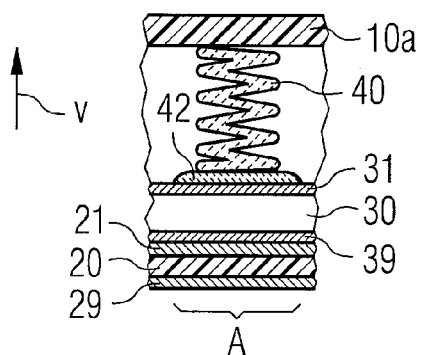
FIG. 14 shows a vertical section through a section of a power semiconductor module in which the pressure element is in the form of a helical spring.

A further alternative for producing a contact pressure acting on the contact region A of the power semiconductor chip 30 is to use a pressure element 40 in the form of a helical spring, as is shown in FIG. 14.

It is also possible to produce a contact pressure by prestressing the package 10 when the power semiconductor module is screwed onto a heat sink 50 such that this produces a force which pushes the pressure element 40 against the contact region of the power semiconductor chip 20.

Figure 15:
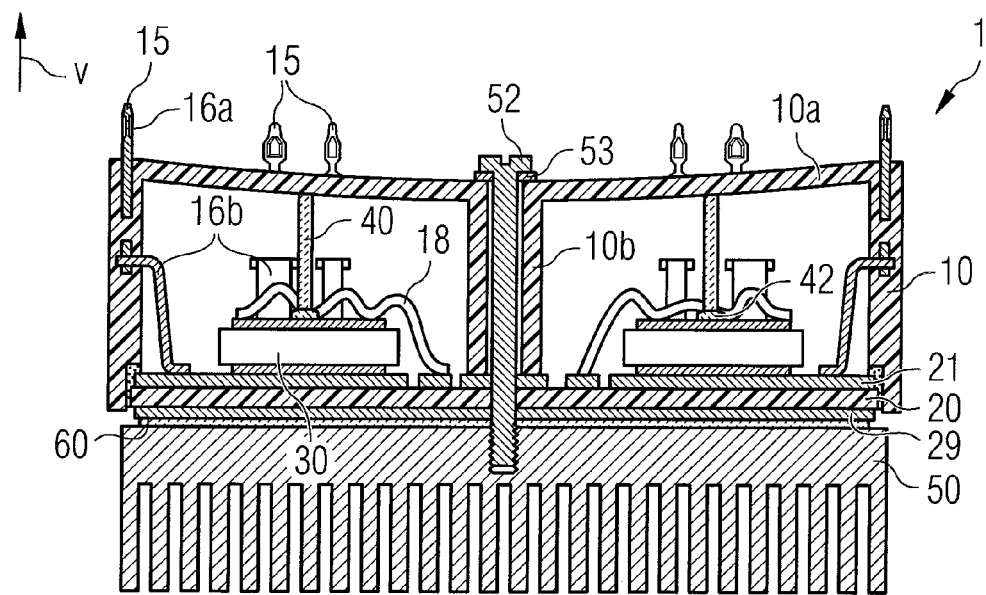
FIG. 15 shows a vertical section through a power semiconductor arrangement with a power semiconductor module which is screwed to a heat sink, a central assembly screw being provided which bends the package cover of the power semiconductor module in the direction of the heat sink and in so doing exerts a contact pressure on the power semiconductor chips via the pressure elements.

As an example in this regard, FIG. 15 shows a vertical section through a power semiconductor arrangement with a power semiconductor module 1 which is screwed to a heat sink 50. The power semiconductor module 1 is screwed by virtue of the provision of a central assembly screw 52 which slightly flexes the package cover 10a of the power semiconductor module 1 in the direction of the heat sink 50 and thereby exerts a contact pressure on the power semiconductor chips 30 in the direction of the heat sink 50 by virtue of the pressure elements 40. The head of the assembly screw 52 and the package cover 10b also comprise an optional washer 53 provided between them. To achieve a defined flexure for the package cover 10a, a web 10b on the package is provided which extends in the vertical direction v and runs approximately perpendicular to the support 20. The geometry of the web 10b is chosen such that the bottom end of the web 10b, facing the metallized support 20, is free, i.e. touches neither the support 20 nor its top metallization 21 or another component permanently connected to the support 20, when the package cover 10a is in the relaxed state, that is to say when the power semiconductor module 1 has not yet been fixed to the heat sink 50. Only when the power semiconductor module 1 is screwed to the heat sink using the central assembly screw 52 is the package cover 10b bent. However, the bending is limited by virtue of the bottom end of the web 10b forming a stop. This means that the vertical dimension of the web 10b may set an initial stress for the package 10 and hence the contact pressure acting on a pressure element 40 in defined fashion. In the arrangement shown in FIG. 15, the web 10b is of tubular design, for example, and is simultaneously used as a guide for the assembly screw 52.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

The invention claimed is:

1. A power semiconductor module comprising
a support;
a power semiconductor chip which comprises a bottom side, facing the support, and a top side, opposite the bottom side;
a pressure element; and
a bonding wire which is bonded to the top side, and which arranged is distant from the pressure element;
where, when the power semiconductor module has the support fixed to a heat sink, the pressure element exerts a contact pressure on the top side in the direction of the heat sink.

2. The power semiconductor module as claimed in claim 1, in which the power semiconductor chip, for the purpose of making electrical contact with it, comprises at least one connection metallization, arranged on the top side, the pressure element exerting the contact pressure in the region of the connection metallization.

3. The power semiconductor module as claimed in claim 2, in which the connection metallization comprises a thickness of more than 6 μm in a direction perpendicular to the top side at least in a section of the connection metallization in which the pressure element exerts the contact pressure on the connection metallization.

4. The power semiconductor module as claimed in claim 2, in which the connection metallization is made of aluminum or copper or nickel or from an alloy or from a lamination containing at least one of these metals.

5. The power semiconductor module as claimed in claim 2, in which the bonding wire is bonded to the connection metallization on which the pressure element exerts the contact pressure.

6. The power semiconductor module as claimed in claim 1, in which the contact pressure acts only on a section of the top side which comprises an area of less than 2 mm×2 mm.

7. The power semiconductor module as claimed in claim 1, in which the pressure element exerts the contact pressure directly on the connection metallization.

8. The power semiconductor module as claimed in claim 1, in which the support comprises a ceramic layer.

9. The power semiconductor module as claimed in claim 8, in which the ceramic layer comprises a thickness of less than or equal to 0.32 mm.

10. The power semiconductor module as claimed in claim 8, in which the ceramic layer comprises, on its side facing the power semiconductor chip, a patterned metallization which is bonded directly to the ceramic layer and to which the power semiconductor chip is soldered, or bonded, or alloyed on by means of diffusion soldering, or adhesively bonded using a conductive adhesive, or connected using a low temperature connection.

11. The power semiconductor module as claimed in claim 10, in which the ceramic layer comprises, on its side facing away from the power semiconductor chip, a metallization which is bonded directly to the ceramic layer.

12. The power semiconductor module as claimed in claim 11, in which the metallization which is arranged on that side of the ceramic which is facing away from the power semiconductor chip and which is bonded directly to the ceramic forms the bottom side of the power semiconductor module.

13. The power semiconductor module as claimed in claim 1 with a package, where the pressure element comprises an anisotropic coefficient of thermal expansion.

* * * * *